United States Patent
Barkley et al.

(10) Patent No.: US 9,406,363 B2
(45) Date of Patent: *Aug. 2, 2016

(54) MEMORY APPARATUS AND SYSTEM WITH SHARED WORDLINE DECODER

(71) Applicant: MICRON TECHNOLOGY, INC., Boise, ID (US)

(72) Inventors: Gerald Barkley, Oregon, WI (US); Efrem Bolandrina, Alzano Lombardo (IT); Daniele Vimercati, Besana in Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/261,674

(22) Filed: Apr. 25, 2014

(65) Prior Publication Data

US 2014/0233338 A1    Aug. 21, 2014

Related U.S. Application Data

(63) Continuation of application No. 13/085,454, filed on Apr. 12, 2011, now Pat. No. 8,730,754.

(51) Int. Cl.
| | |
|---|---|
| *G11C 8/00* | (2006.01) |
| *G11C 8/10* | (2006.01) |
| *G11C 5/02* | (2006.01) |
| *G11C 8/14* | (2006.01) |

(52) U.S. Cl.
CPC ........... *G11C 8/10* (2013.01); *G11C 5/025* (2013.01); *G11C 8/14* (2013.01)

(58) Field of Classification Search
CPC ............. G11C 5/025; G11C 8/10; G11C 8/14
See application file for complete search history.

(56) References Cited

U.S. PATENT DOCUMENTS

| | | | | |
|---|---|---|---|---|
| 6,426,914 | B1 * | 7/2002 | Dennard ................. | G11C 7/22 365/189.06 |
| 7,965,561 | B2 * | 6/2011 | Garofalo ................. | G11C 8/10 365/185.11 |
| 8,730,754 | B2 * | 5/2014 | Barkley ................. | G11C 5/025 365/230.03 |
| 2008/0101149 | A1 * | 5/2008 | Fasoli ..................... | G11C 8/10 365/230.06 |
| 2010/0091541 | A1 * | 4/2010 | Park ........................ | G11C 5/02 365/51 |
| 2012/0263005 | A1 * | 10/2012 | Barkley ................. | G11C 5/025 365/230.03 |

* cited by examiner

*Primary Examiner* — Hoai V Ho
*Assistant Examiner* — Pablo Huerta
(74) *Attorney, Agent, or Firm* — Dorsey & Whitney LLP

(57) ABSTRACT

A memory device includes wordline decoder circuits that share components between adjacent memory blocks. The wordline decoder circuits include multiple levels, where at least one level is split, driving half of the wordlines in one adjacent memory block and driving half of the wordlines in another adjacent memory block. Memory blocks have every other wordline coupled to one adjacent decoder circuit, and the remaining wordlines coupled to another adjacent decoder circuit.

19 Claims, 7 Drawing Sheets

MEMORY APPARATUS AND SYSTEM WITH SHARED WORDLINE DECODER

CROSS-REFERENCE TO RELATED APPLICATION

This application is a continuation of U.S. patent application Ser. No. 13/085,454, filed Apr. 12, 2011. This application is incorporated by reference herein in its entirety and for all purposes.

FIELD

The present invention relates generally to memory devices, and more specifically to wordline decoding in memory devices.

BACKGROUND

Semiconductor memory devices continue to shrink in size. Semiconductor devices in general continue to shrink because device minimum feature sizes continue to shrink. Reduced feature sizes result in higher memory storage density per unit die area and reduce die cost. Memory storage density per unit die area can also be increased by increasing the efficiency with which the memory array and related circuits are organized on the die.

Outside of the memory array, decoder circuits consume the largest silicon area of repeated structures on large density die (>128 Mb). Reducing the area of the decoders will significantly increase storage density per unit die area and reduce the cost of the die.

BRIEF DESCRIPTION OF THE DRAWINGS

Embodiments of the invention are illustrated by way of example and not limitation in the figures of the accompanying drawings, in which.

DESCRIPTION OF EMBODIMENTS

Figure 1:
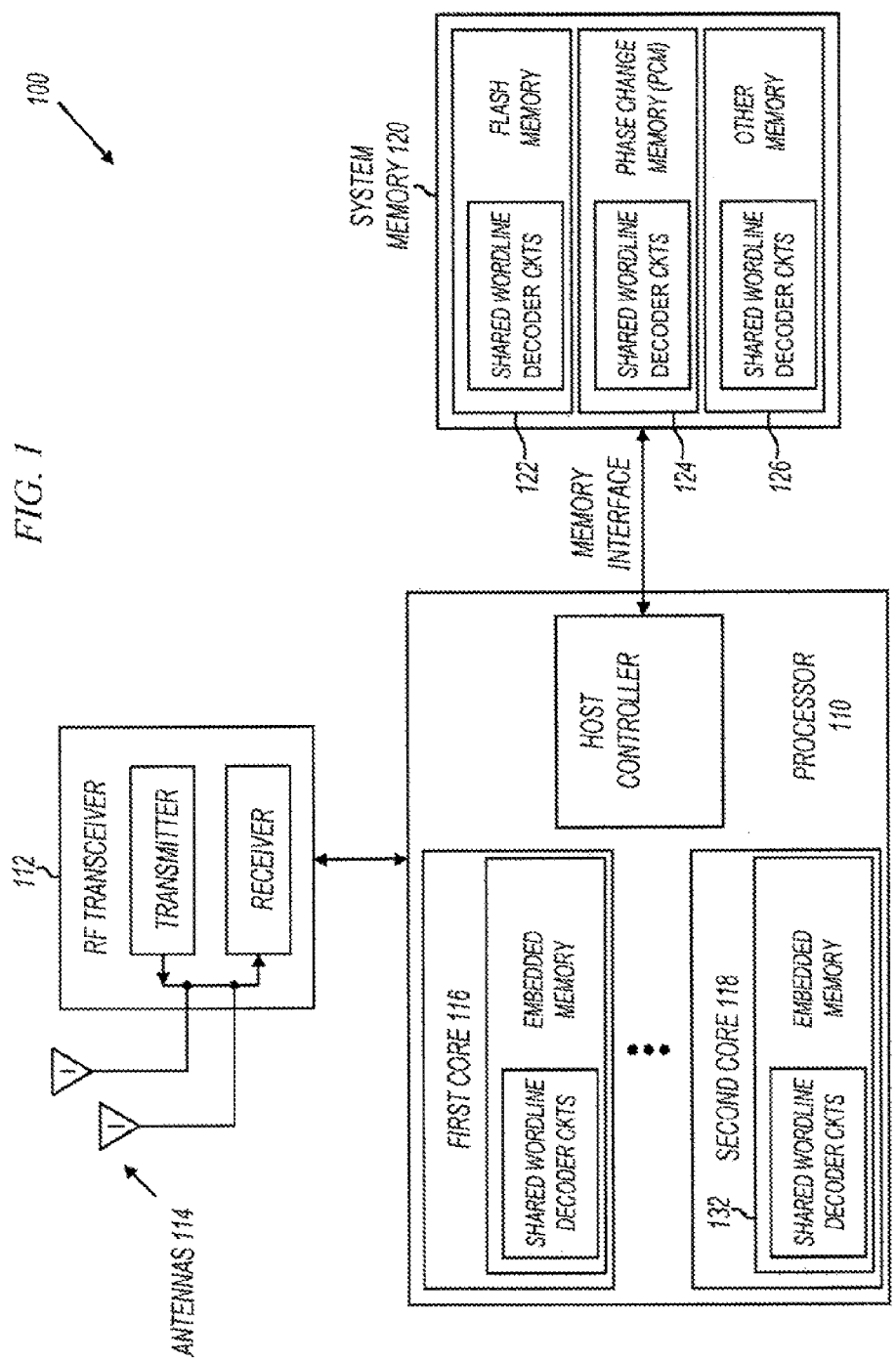
FIG. 1 shows an electronic system in accordance with various embodiments of the invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g. as in a cause an effect relationship).

FIG. 1 shows a system 100 in accordance with various embodiments of the present invention. System 100 may be any type of device that includes memory without departing from the scope of the present invention. For example, system 100 may be a computer or a mobile phone with nonvolatile memory. Also for example, system 100 may be a global positioning system (GPS) receiver or a portable media player with nonvolatile memory.

The wireless architecture embodiment illustrated in FIG. 1 shows a communications device 100 that includes one or more memory devices with shared wordline decoder circuits in accordance with the present invention. It should be noted that the present invention is not limited to wireless communication embodiments and other, non-wireless applications may use the present invention. As shown in this wireless embodiment, communications device 100 includes one or more antenna structures 114 to allow radios to communicate with other over-the-air communication devices. As such, communications device 100 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems collocated in the same platform of communications device 100 provide the capability of communicating with different frequency bands in an RF/location space with other devices in a network. It should be understood that the scope of the present invention is not limited by the types of, the number of, or the frequency of the communication protocols that may be used by communications device 100.

The embodiment illustrates the coupling of antenna structure 114 to a transceiver 112 to accommodate modulation/demodulation. In general, analog front end transceiver 112 may be a stand-alone Radio Frequency (RF) discrete or integrated analog circuit, or transceiver 112 may be embedded with a processor having one or more processor cores. The multiple cores allow processing workloads to be shared across the cores and handle baseband functions and application functions.

Processor 110 includes at least first core 116; in the embodiment depicted in FIG. 1 processor 110 also includes second core 118, and each core may include memory. For example, first core 116 may include volatile or nonvolatile memory such as phase change memory (PCM), FLASH, or RAM. Each core may include any combination of different types of memory without departing from the scope of the present invention. Processor 110 may execute instructions from any suitable memory within system 100. For example, any memory within a processor core, or any of the memory devices within system memory 120, may be considered a computer-readable medium that has instructions stored that when accessed cause processor 110 to perform according to embodiments of the invention.

First core 116 and second core 118 may also make use of Magnetic Random Access Memory (MRAM), which employs magnetic storage elements formed from two ferromagnetic plates located at an intersection of a row and column line and selected by a Magnetic Tunnel Junction (MTJ) device. Current imparted to the row line in one direction causes a magnetic field operative on the MRAM cell biasing the MRAM cell toward a binary state. Due to a magnetic tunnel effect, the electrical resistance of the memory cell changes based on the orientation of the fields in the two plates.

First core 116 and the second core 118 may also make use of Ferro-electric Random Access Memory (FRAM), which employs memory cells that may include one transistor and one capacitor. The capacitor includes ferroelectric material and a bi-stable atom in the ferroelectric material that is shifted to form two stable polarization states. Memory cell data may be written by positively or negatively orienting the dipoles of the ferroelectric material via an applied polarizing voltage. Data may be read by detecting the voltage of the bit line (BL) connected with the memory cell. Current feed circuits supply electric currents to the bit lines for a predetermined period from a start of a read operation, and read control circuitry senses the direction of the electric polarization as either a high or a low logic state. Each orientation is stable and remains in place even after the electric field is removed, preserving the data within the memory without periodic refresh.

Processor 110 is shown including a host controller with a memory interface to system memory 120. While the host controller is shown with only an interface to system memory 120, this is not a limitation of the present invention. For example, processor 110 may communicate with memory devices in system memory 120, a solid state disk (SSD) with memory (not shown), a magnetic storage disk (not shown) or any other type of device.

System memory 120 may be provided by one or more different types of memory having shared wordline decoder circuits. The memories within system memory 120 may be combined in a stacking process to reduce the footprint on a board, packaged separately, or placed in a multi-chip package with the memory component placed on top of the processor. The embodiment also illustrates that one or more of the processor cores may be embedded with nonvolatile memory 132 having shared wordline decoder circuits.

System memory 120 includes FLASH memory 122, phase change memory (PCM) 124, and other memory 126. FLASH memory 124 stores information by storing charge on a floating gate in a Metal Oxide Semiconductor (MOS) transistor. The stored charge alters the threshold voltage of the transistor, and the difference in threshold voltage is "read" to determine whether the stored information is a "0" or a "1". In some embodiments, varying amounts of charge are stored on the floating gate to represent more than one bit of information per memory cell. This is sometimes referred to as Multi-Level Cell (MLC) FLASH. FLASH memory 122 may be any type of FLASH memory, including NOR FLASH memory, NAND single level cell (SLC) memory, or NAND multi-level cell (MLC) memory.

System memory 120 also includes phase change memory (PCM) 124. PCM is memory that stores information based on modifiable material properties, such as whether a material is in a crystalline or an amorphous state (phase). For example, in some embodiments, phase change memories include alloys of elements of group VI of the periodic table, such as Te or Sc, that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage. Phase change memory may be referred to as a Phase Change Memory (PCM). Phase-Change Random Access Memory (PRAM or PCRAM), Ovonic Unified Memory (OUM), Chalcogenide Random Access Memory (C-RAM), or by other suitable names.

Memory devices within system memory 120 may be packaged in any manner. For example, in some embodiments, FLASH memory 122, PCM 124, and other memory 126 may be combined in a stacking process to reduce the footprint on a board, packaged separately, or placed in a multi-chip package with the memory component placed, on top of the processor. The FLASH memory 122 may comprise multiple FLASH memories to increase capacity and/or bandwidth.

Figure 2:
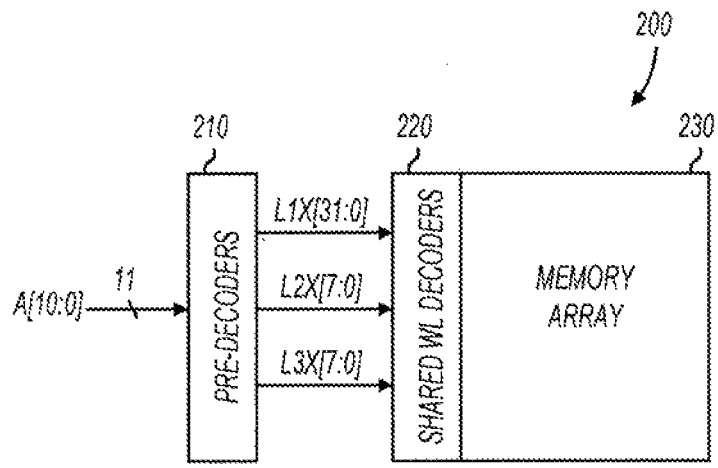
FIG. 2 show a memory device in accordance with various embodiments of the invention.

FIG. 2 show a memory device in accordance with various embodiments of the invention. Memory device 200 includes memory array 230, shared wordline (WL) decoders 220, and pre-decoders 210. Memory device 200 may be any type of memory device (e.g., FLASH, RAM, PCM, MRAM, FRAM, etc.) and may be utilized anywhere in a system (e.g., memory embedded in a processing core, system memory, solid state disk, etc.).

Memory device 200 is illustrated with a minimum of components to accentuate the decoding of address lines to wordlines. In practice, memory device 200 includes many other structures not shown in FIG. 2. For example, memory device 200 may include sense amplifiers, voltage references, programming circuits, charge pumps, logic circuits, pads, any many other structures.

Figure 3:
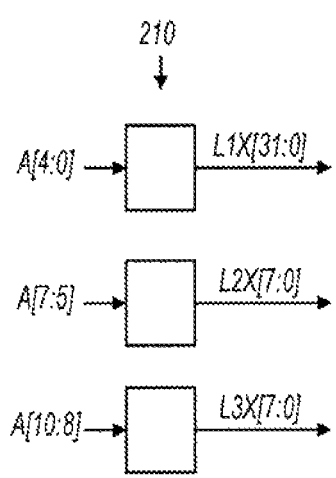
FIG. 3 shows wordline pre-decoders in accordance with various embodiments of the present invention.

Pre-decoders 210 receive address lines A[10:0] and provide partially decoded output signals L1X[31:0], L2X[7:0], and L3X[7:0]. The example of FIG. 2 shows eleven address lines, but this is not a limitation of the present invention. Any number of address lines (corresponding to any array density) may be present. FIG. 3 shows an example pre-decoding structure to decode A[10:0] into L1X[31:0], L2X[7:0], and L3X [7:0]. L1X[31:0] are referred to as the "level one x-decode signals;" L2X[7:0] are referred to as the "level two x-decode signals;" and L3X[7:0] are referred to as the "level three x-decode signals."

The various levels of decode signals (L1X, L2X, L3X) drive different portions of the shared wordline decoders 220. For example, L1X drive "level one decoders," L2X drive "level two decoders," and L3X drive "level three decoders." The various levels of wordline decoders are distributed about memory array 230, and at least one level is shared among adjacent memory blocks. Although three levels of pre-decoding are shown in FIGS. 2 and 3, this is not a limitation of the present invention. For example, in some embodiments, there may be a fourth level, a fifth level, etc.

Figure 4:
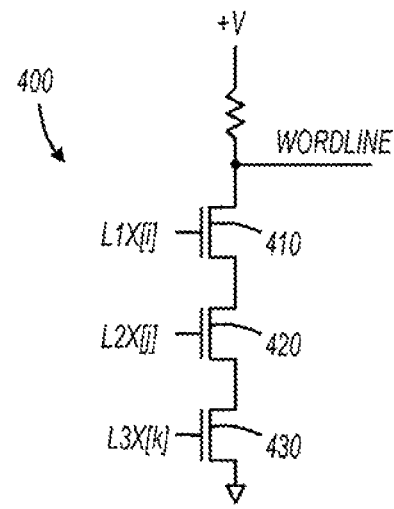
FIG. 4 shows one wordline selection path in a shared wordline decoder in accordance with various embodiments of the invention.

FIG. 4 shows one wordline selection path in a shared wordline decoder in accordance with various embodiments of the invention. Circuit 400 includes selection transistors 410, 420, and 430. As shown in FIG. 4, any one wordline is selected when all of the selection transistors in the corresponding selection path are conducting. The selection transistors are conducting when the corresponding level one, two, and three decoder signals are asserted.

Selection transistor 410 is one transistor in a level one decoder, selection transistor 420 is one transistor in a level two decoder, and selection transistor 430 is one transistor in a level three decoder. When all three selection transistors are on, the wordline is selected. In some embodiments, the level one decoder is a split decoder that drives wordlines in more than one memory block. For example, half of the selection transistor in the level one decoder may drive wordlines in one adjacent memory block, while the other half of the selection transistors in the level one decoder may drive wordlines in another adjacent memory block. This is described in more detail below.

In some embodiments, the level two and level three decoders are "shared" between adjacent memory blocks. For example, selection transistors in the level one decoder, although driving wordlines in adjacent memory blocks, are selected in common by transistors in the level two and three decoders. This is also described in more detail below. In some embodiments, more than three levels of wordline decoders are provided, and/or more than two levels are shared. For example, additional pre-decoders may provide L4X, L5X, or more decode signals. In these embodiments, additional selection transistors are included in each wordline selection path.

Figure 5:
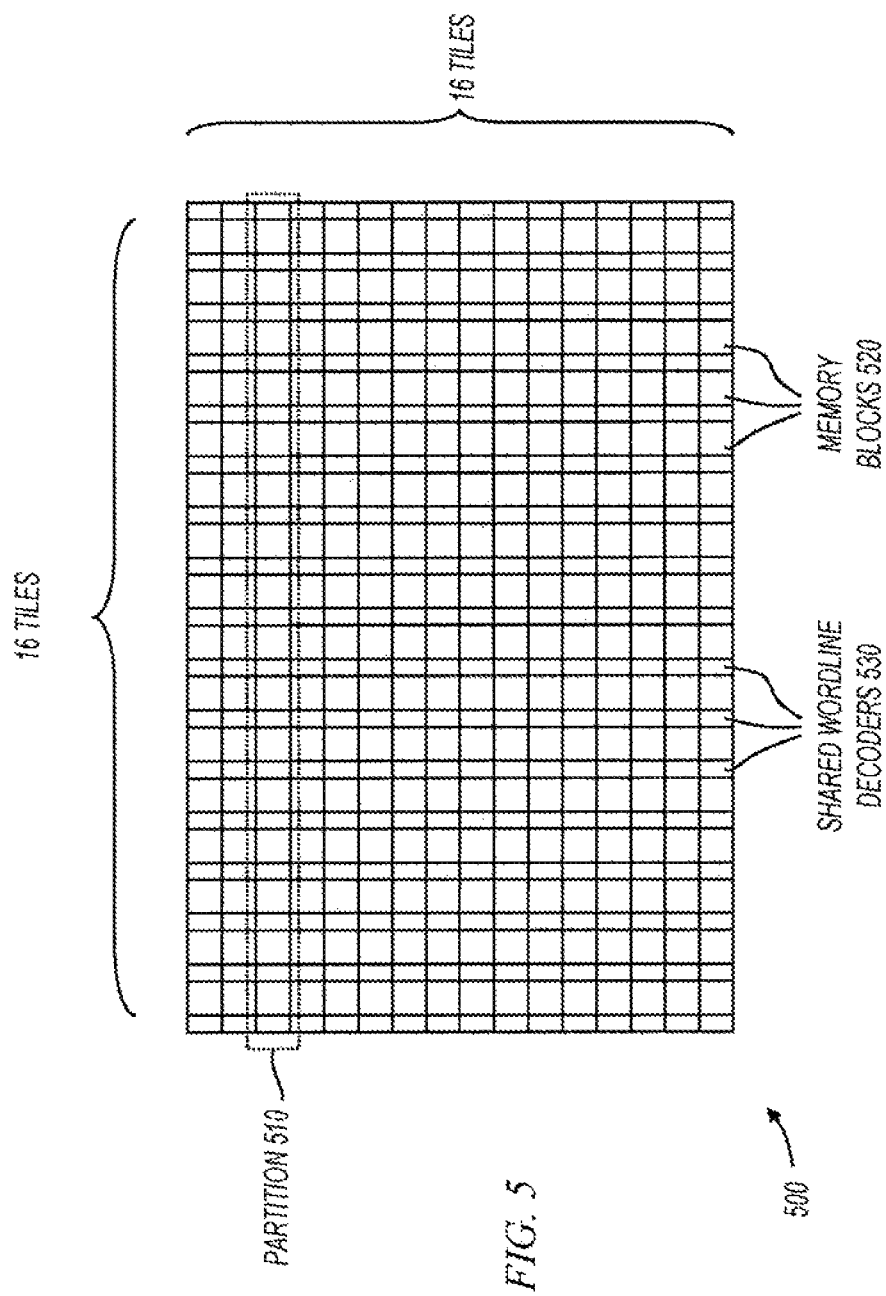
FIG. 5 shows a memory array in accordance with various embodiments of the invention.

FIG. 5 shows a memory array in accordance with various embodiments of the invention. Memory array 500 includes memory blocks 520 interspersed with shared wordline decoders 530. Memory array 500 includes repeating, structures, referred to herein as "tiles." In the example of FIG. 5, the array includes 16×16 tiles. One row of tiles is referred to as a partition. One example partition 510 is called out in FIG. 5. Pre-decoders (not shown) decode address lines and drive the shared wordline decoders 530 with L1X, L2X, and L3X signals. Within a given partition, shared wordline decoders 530 that are adjacent to multiple memory blocks drive wordlines in the multiple adjacent memory blocks.

Figure 6:
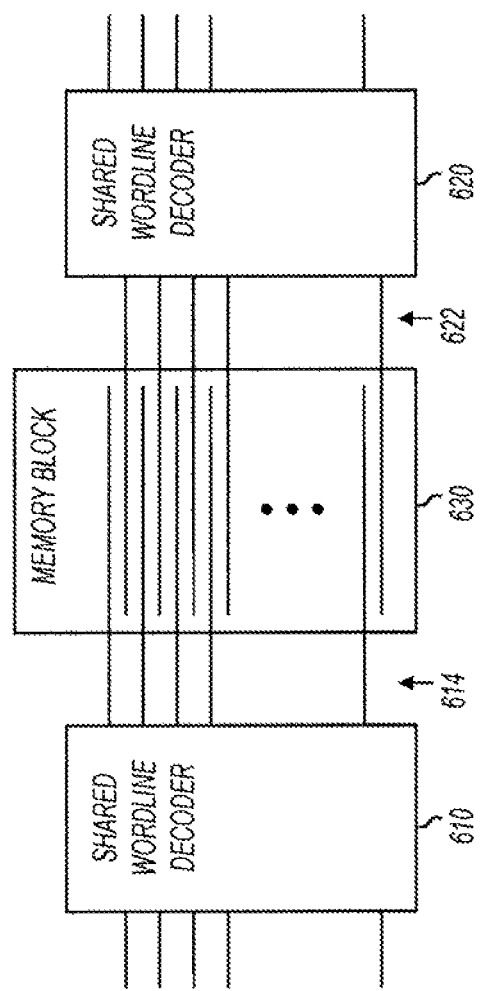
FIG. 6 shows a memory block with shared wordline decoders in accordance with various embodiments of the invention.

FIG. 6 shows a memory block with shared wordline decoders in accordance with various embodiments of the invention. Memory block 630 corresponds to one of memory blocks 520 in memory array 500, and shared wordline decoders 610 and 620 correspond to shared wordline decoders 530 on either side of the memory block. The Level, one decoders within shared wordline decoders 610 and 620 are split, each driving half of the wordlines in memory block 630. Level two and level three decoders within shared wordline decoders 610 and 620 are shared.

In some embodiments, every other wordline in a memory block is driven by a shared wordline decoder adjacent to the memory block on one side, and the remaining wordlines are driven by a shared wordline decoder adjacent to the memory block on another side. For example, shared wordline decoder 610 drives even numbered wordlines 614 in memory block 630, and shared wordline decoder 620 drives odd numbered wordlines 622 in memory block 630. Driving every other wordline in a memory block allows the level one decoder to match the pitch of every other wordline in the memory block.

Figure 7:
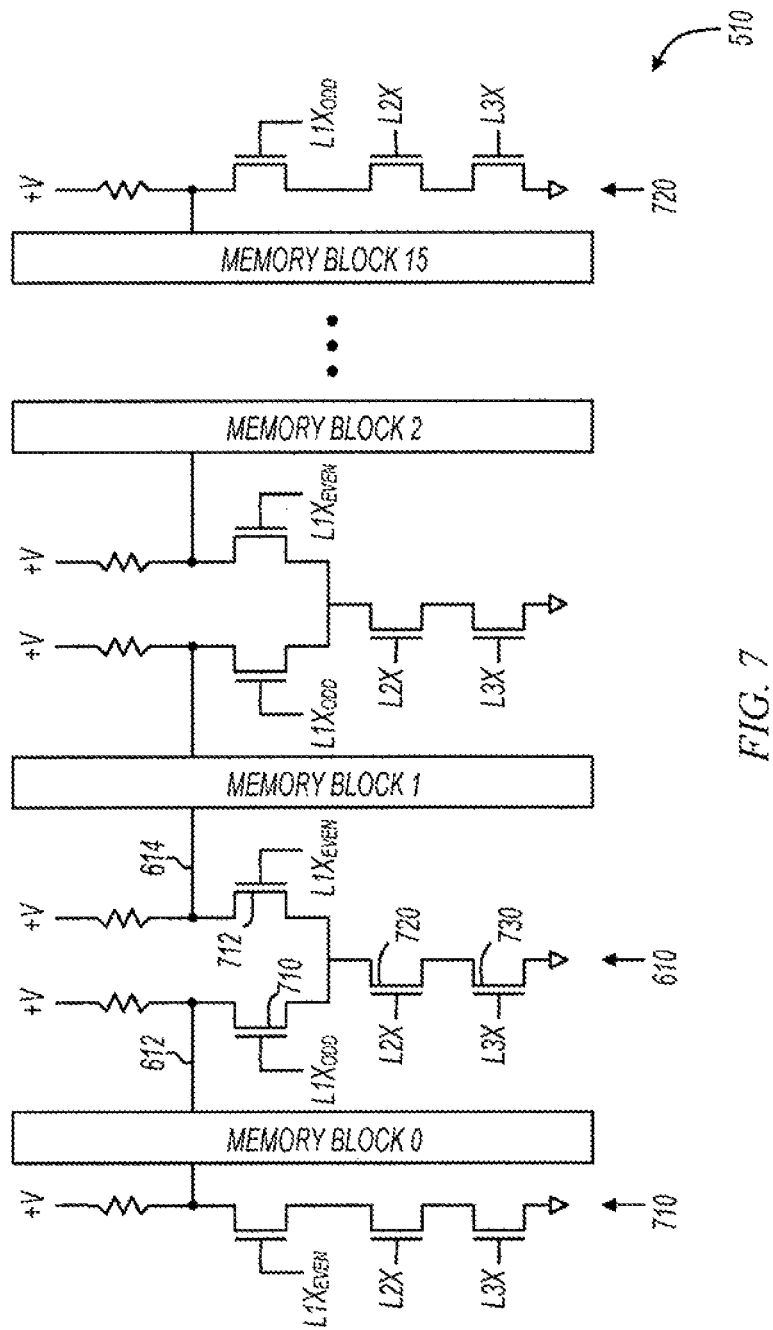
FIG. 7 shows memory blocks and shared wordline decoders in a partition of a memory device in accordance with various embodiments of the invention.

FIG. 7 shows memory blocks and shared wordline decoders in a partition of a memory device in accordance with various embodiments of the invention. Partition 510 of FIG. 7 corresponds to partition 510 of FIG. 5 with 16 memory blocks. Shared wordline decoders are positioned between adjacent memory blocks. As an example, shared wordline decoder 610 is a multi-level wordline decoder that includes a level one decoder represented by transistors 710 and 712; a level two decoder represented by transistor 720; and a level three decoder represented by transistor 730. The level one decoders are split into two sections: the first section to drive half of the wordlines 612 in the memory block to the left; and a second section to drive half of the wordlines 614 in the memory block to the right. The level two decoders and the level three decoders are shared between the memory blocks to the left and right.

The level one decoding is unique to each memory block and, as shown in FIG. 7, each memory block has level one decoders along two opposite sides of the block. The level one decoder on one side of the memory block is coupled to all of the even wordlines in the block and the level one decoder on the other side of the memory block is coupled to all of the odd wordlines in the block.

Level two and level three decoders outside the outer most blocks only drive wordlines in a single block, and so the level two and level three decoders in these decoders are not shared across multiple memory blocks. For example, decoder 710 only drives wordlines in memory block 0, and decoder 720 only drives wordlines in memory block 15.

Figure 8:
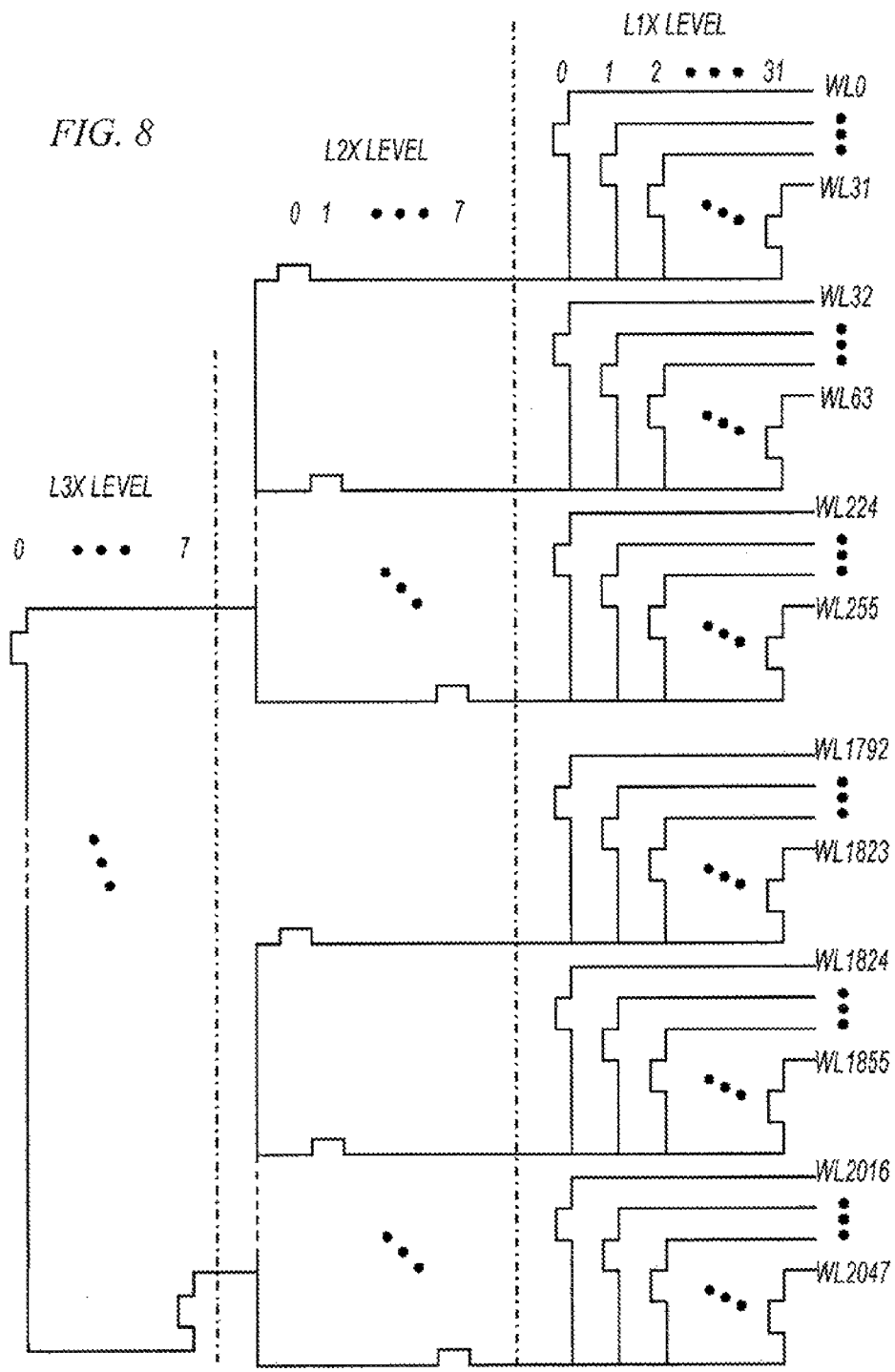
FIG. 8 shows a shared wordline decoder structure in accordance with various embodiments of the invention.

FIG. 8 shows a shared wordline decoder structure in accordance with various embodiments of the invention. As shown in FIG. 8, eight selection transistors exist in the level three (L3X level). Gates of the L3X selection transistors are driven by L3X[7:0]. For each of the eight L3X selection transistors, there exists eight L2X transistors. Gates of the L2X transistors are driven by L2X[7:0]. For each of the L2X selection transistors, there exists 32 L1X transistors. Gates of the L1X transistors are driven by L1X[31:0].

During wordline selection, the assertion of one signal in L3X[7:0] turns on one L3X selection transistor, which selects one group of eight L2X selection transistors. The assertion of one signal in L2X [7:0] in turn selects one group of 32 L1X selection transistors. Up to this point, the decoding is shared between two adjacent memory blocks. The assertion of one signal in L1X[31:0] will provide the final selection of a wordline. The selected wordline will either be an odd wordline coupled to a memory block on one side, or an even wordline coupled to a memory block on the other side. Accordingly, the level one decoders are split, and the level two and level three decoders are shared.

Figure 9:
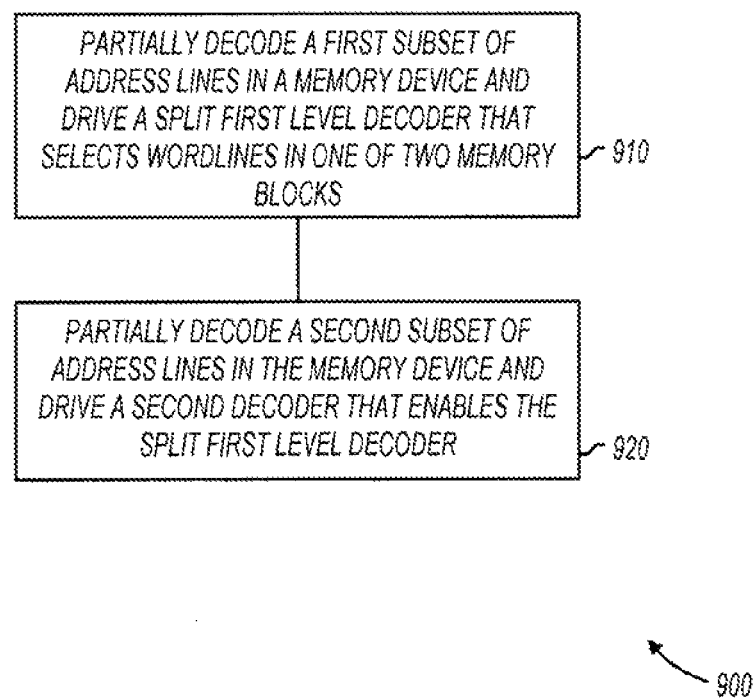
FIG. 9 shows a flow diagram in accordance with various embodiments the present invention.

FIG. 9 shows a flow diagram in accordance with various embodiments of the present invention. At 910, a first subset of address lines in a memory device are decoded. This corresponds to the operation of a pre-decoder such as those shown in FIGS. 2 and 3. Specifically, this may correspond to the decoding of A[4:0] to L1X[31:0]. Also at 910, a split first level decoder is driven to select wordlines in one of two memory blocks. This corresponds to one signal in L1X[31:0] selecting a wordline. The first level decoder is split to drive half of the wordlines in one adjacent memory block and to drive one half of the wordlines in another adjacent memory block. For example, if an even wordline is selected, then a wordline in a memory block to the right will be selected, and if an odd wordline is selected, then a wordline in a memory block to the left will be selected.

At 920, a second subset of address lines in the memory device is decoded, and a second decoder is driven to enable the split level decoder. This corresponds to the operation of either or both of the pre-decoders that decode A[7:5] and A[10:8], and driving either or both of the level two and level three decoders with L2X[7:0] and L3X[7:0], respectively.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. An apparatus, comprising:
a decoder circuit coupled to a first memory block and a second memory block, the decoder circuit including a first level decoder and a shared second level decoder coupled to the first level decoder, the decoder circuit configured to select wordlines of the first memory block responsive to a first section of the first level decoder and the shared second level decoder being enabled, and to select wordlines of the second memory block responsive to a second section of the first level decoder and the shared second level decoder being enabled; and
a plurality of pre-decoder circuits, each of the plurality of pre-decoder circuits coupled to a respective level decoder and configured to enable the respective level decoders based on a respective number of bits of an address signal.

2. The apparatus of claim 1, wherein the decoder circuit comprises three decoder levels serially coupled and wherein the first level decoder includes two sections with each section of the first level decoder coupled to a second level decoder.

3. The apparatus of claim 2, wherein the second level decoder is coupled to a third level decoder.

4. The apparatus of claim 3, wherein the wordlines of the first or second memory block are selected when the first, second and third level decoders are enabled.

5. The apparatus of claim 3, wherein the second level decoder and the third level decoder are shared between the first and second memory blocks.

6. The apparatus of claim 1, wherein every other wordline of the first memory block is selected by first section of the first level decoder being enabled.

7. The apparatus of claim 1, wherein the first section of the first level decoder is coupled to even wordlines of the first memory block and the second section of the first level decoder is coupled to odd wordlines of the second memory block.

8. The apparatus of claim 1, wherein a respective one of the plurality of pre-decoder circuits is coupled to the first level decoder and is configured to enable either the first section or the second section of the first level decoder based on the respective bits of the address signal, and wherein the respective bits of the address signal may enable at least one wordline associated with either the first or second section of the first level decoder.

9. A method, comprising:
pre-decoding an address into a plurality of pre-decoded control signals, wherein each of the plurality of pre-decoded control signals control a respective level decoder;
sharing a second level decoder between first and second sections of a first level decoder;
enabling the second level decoder responsive to a respective pre-decoded control signal; and
selectively enabling the first section of the first level decoder, independent of the second section of the first level decoder, responsive to a respective pre-decoded control signal to select half of a plurality of wordlines of a first memory block.

10. The method of claim 9, further comprising:
enabling the second section of the first level decoder responsive to a respective pre-decoded control signal to select half of a plurality of wordlines of a second memory block.

11. The method of claim 9, further comprising enabling a third level decoder responsive to a respective pre-decoded control signal, wherein the half of the plurality of wordlines of the first memory block will be selected when the first, second, and third level decoders are enabled.

12. An apparatus, comprising:
a decoder circuit including a third level decoder and a second level decoder, both the third and second level decoders shared between first and second sections of a first level decoder, the first section of the first level decoder coupled to half of a plurality of wordlines of a first memory block and the second section of the first level decoder coupled to half of a plurality of wordlines of a second memory block that is adjacent the first memory block,
wherein the first and second sections of the first level decoder, the second level decoder, and the third level decoder are enabled by respective control signals; and
a plurality of pre-decoder circuits configured to receive respective address lines and provide the respective control signals in response.

13. The apparatus of claim 12, wherein a respective one of the plurality of pre-decoder circuits associated with the first section of the first level decoder is driven by a first subset of address lines and a respective one of the plurality of pre-decoder circuits associated with the second section of the first level decoder is driven by a second subset of address lines.

14. The apparatus of claim 13, wherein the first subset of address lines are even numbered address lines from a partial address and the second subset of address lines are odd numbered address lines form the partial address.

15. The apparatus of claim 12, wherein a respective one of the plurality of pre-decoder circuits associated with the second level decoder is driven by a third subset of address lines.

16. The apparatus of claim 12, wherein a respective one of the plurality of pre-decoder circuits associated with the third level decoder is driven by a fourth subset of address lines.

17. The apparatus of claim 12, wherein half of the plurality of wordlines of the first memory block are selected by enabling the first section of the first level decoder, the shared second level decoder, and the shared third level decoder.

18. The apparatus of claim 12, wherein half of the plurality of wordlines of the second memory block are selected by enabling the second section of the first level decoder, the shared second level decoder, and the shared third level decoder.

19. The apparatus of claim 12, wherein the half of the plurality of wordlines of a first memory block are selected by the decoder circuit and a remaining half of the plurality of wordlines are selected by a second decoder circuit, the second decoder circuit physically located on an opposite side of the first memory block.

* * * * *